US00H002207H

(19) United States
(12) Statutory Invention Registration
Bijker

(10) Reg. No.: US H2207 H
(43) Published: Dec. 4, 2007

(54) ADDITIONAL POST-GLASS-REMOVAL PROCESSES FOR ENHANCED CELL EFFICIENCY IN THE PRODUCTION OF SOLAR CELLS

(76) Inventor: Martin D. Bijker, Betuwehof 64, Helmond 5709 KR (NL)

(21) Appl. No.: 11/650,595

(22) Filed: Jan. 5, 2007

(51) Int. Cl.
*H01L 21/336* (2006.01)

(52) U.S. Cl. ..... 438/287
(58) Field of Classification Search ..... None
See application file for complete search history.

(56) References Cited

U.S. PATENT DOCUMENTS

| | | | | |
|---|---|---|---|---|
| 6,946,404 | B2 * | 9/2005 | Bijker et al. | 438/778 |
| 2004/0029334 | A1 * | 2/2004 | Bijker et al. | 438/200 |
| 2006/0231031 | A1 * | 10/2006 | Dings et al. | 118/723 R |
| 2006/0292891 | A1 * | 12/2006 | Bijker et al. | 438/778 |

* cited by examiner

*Primary Examiner*—Daniel Pihulic
(74) *Attorney, Agent, or Firm*—Pillsbury Winthrop Shaw Pittman LLP

(57) ABSTRACT

A method is provided for the production of solar cells from raw crystalline p-type silicon wafer material. The surface condition prior to SiNx deposition is improved by providing additional process steps following the phosphorous glass removal and prior to the SiNx anti-reflection coating deposition. In one embodiment, the wafer is submitted to a thermal anneal under oxygen atmosphere followed by a wet-chemical oxide removal. The anneal reduces the surface phosphorous concentration by diffusion, reduces lattice defects in the emitter and oxidizes the silicon surface. In another embodiment, both a surface oxide is obtained and subsequently removed with wet chemistry. This sequence allows for an integration of the phosphorous glass removal, the wet-chemical oxidation, and the SiOx removal into a single machine.

2 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

ADDITIONAL POST-GLASS-REMOVAL PROCESSES FOR ENHANCED CELL EFFICIENCY IN THE PRODUCTION OF SOLAR CELLS

FIELD OF THE INVENTION

This invention relates to the process sequence in the production of solar cells from raw crystalline p-type silicon wafer material.

Process tests show that the cell efficiencies obtained with the current production lines can be improved significantly by inserting one or more additional process steps.

BACKGROUND OF INVENTION

The process sequence of the existing production lines is shown in FIG. 1. The saw-damage and impurities present on the raw silicon wafers are removed with a wet etching. Simultaneously with this process a defined surface texture is obtained. A phosphorous containing precursor is deposited that serves as the phosphorous source during the emitter diffusion in a horizontal passage furnace. A phosphorous glass layer is formed during diffusion. This layer is removed with wet etching prior to the deposition of a SiNx anti-reflection coating. Front- and back-side metallization is realized by screen printing and firing of metallization pastes. Finally, laser ablation electrically isolates the emitter and collector at the edge of the wafer.

The cell efficiency obtained with the process sequence described in FIG. 1 is limited by the surface condition that is obtained after the phosphorous glass removal. The non-ideal surface condition may originate from:

(a) an excessively large phosphorous concentration;

(b) residues left from the preceding processes that are not removed by the standard wet chemical glass removal;

(c) segregation of impurities from the bulk to the surface during preceding processes that are not removed by the standard wet chemical glass removal; and (d) nanometer-scale surface roughness (e.g. porous silicon).

SUMMARY OF THE INVENTION

It is, therefore, an object of the present invention to provide an improved process sequence for the production of solar cells from raw crystalline p-type silicon wafer material.

In a first embodiment of the invention, a process is provided for producing solar cells from a silicon wafer, comprising the steps of:

(a) removing any saw-damage on the wafer by a wet-chemical etching process, thereby defining surface texture on the wafer;

(b) depositing a phosphorous containing precursor on the wafer;

(c) placing the wafer in a furnace, thereby initiating emitter diffusion;

(d) removing a phosphorous glass layer, formed on the surface of the wafer during the emitter diffusion step, by a wet-chemical etching process;

(e) thermally annealing the wafer under an oxygen atmosphere;

(f) removing oxides from the wafer by a wet-chemical etching process;

(g) depositing a SiNx anti-reflection coating on the wafer;

(h) screen printing metallization pastes on the surface of the wafer;

(i) firing the metallization pastes formed on the surface of the wafer; and (j) laser ablating the wafer, thereby isolating the emitters and collectors formed at the edges of the wafer.

In a second embodiment of the invention, a process for producing a solar cell from a silicon wafer, comprising the steps of:

(a) removing any saw-damage on the wafer by a wet-chemical etching process, thereby defining surface texture on the wafer;

(b) depositing a phosphorous containing precursor on the wafer;

(c) placing the wafer in a furnace, thereby initiating emitter diffusion;

(d) removing a phosphorous glass layer, formed on the surface of the wafer during the emitter diffusion step, by a wet-chemical etching process;

(e) oxidizing the surface of the wafer by a wet-chemical process;

(f) removing oxides from the wafer by a wet-chemical etching process;

(g) depositing a SiNx anti-reflection coating on the wafer;

(h) screen printing metallization pastes on the surface of the wafer;

(i) firing the metallization pastes formed on the surface of the wafer; and (j) laser ablating the wafer, thereby isolating the emitters and collectors formed at the edges of the wafer.

Other objects, features, and advantages of one or more embodiments of the present invention will seem apparent from the following detailed description, and accompanying drawings, and the appended claims.

BRIEF DESCRIPTION OF THE DRAWINGS

Embodiments of the present invention will now be disclosed, by way of example only, with reference to the accompanying schematic drawings in which corresponding reference symbols indicate corresponding parts, in which.

DETAILED DESCRIPTION

Figure 1:
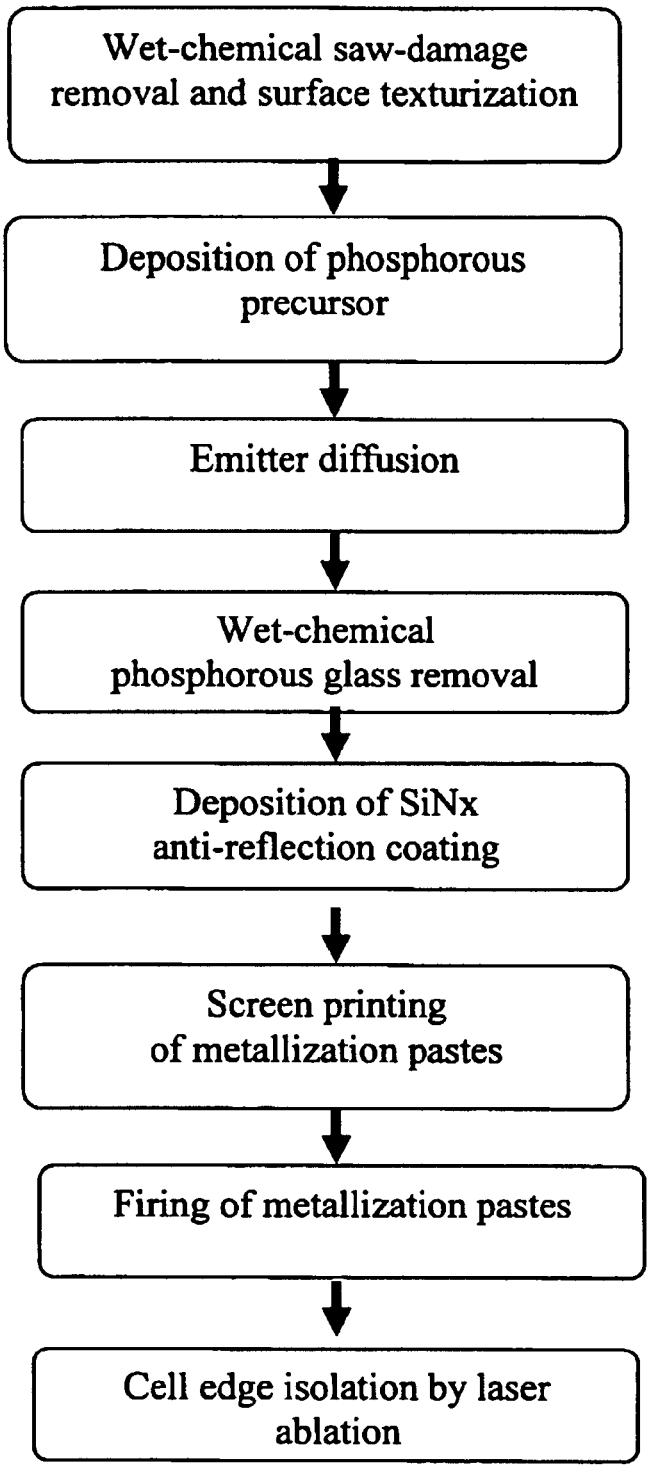
Figure 1 (PRIOR ART)
FIG. 1 shows the process sequence of the existing production lines.
Figure 2:
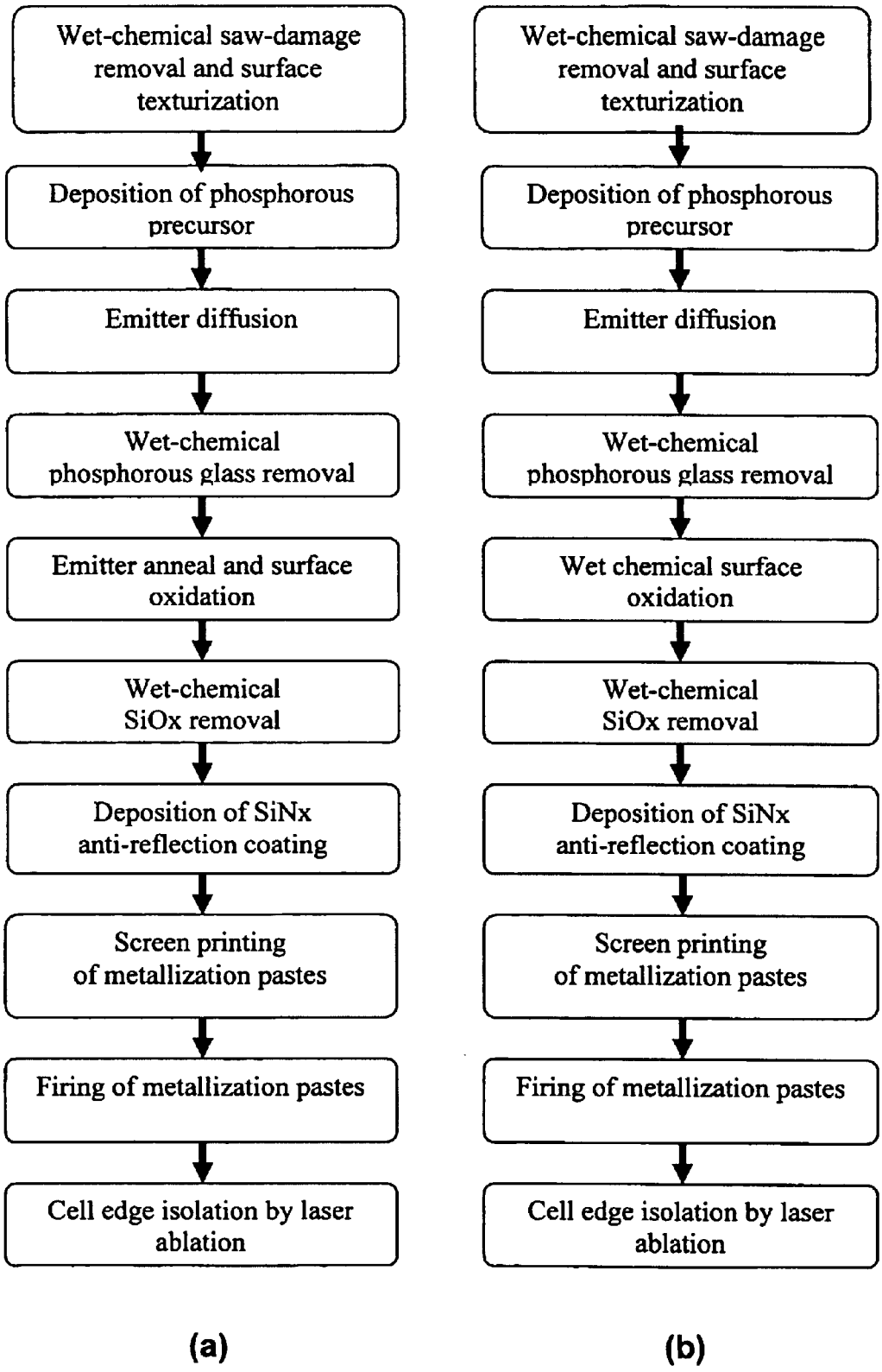
FIG. 2 shows two sequence embodiments with additional process steps, in accordance with the invention.

The surface condition prior to SiNx deposition is improved by providing additional process steps following the phosphorous glass removal and prior to the SiNx anti-reflection coating deposition. FIG. 2 shows two sequence embodiments with additional process steps, in accordance with the invention.

In the first embodiment, as shown in FIG. 2(*a*), the wafer is submitted to a thermal anneal under oxygen atmosphere followed by a wet-chemical oxide removal. The anneal reduces the surface phosphorous concentration by diffusion, reduces lattice defects in the emitter and oxidizes the silicon surface.

In the second embodiment, as shown in FIG. 2(*b*), both a surface oxide is obtained and subsequently removed with wet chemistry. This sequence allows for an integration of the phosphorous glass removal, the wet-channel oxidation, and the SiOx removal into a single machine.

A combination of the two sequences described above is also envisioned.

While the specific embodiments of the present invention have been described above, it will be appreciated that the invention may be practiced otherwise than described. The description is not intended to limit the invention.

What is claimed is:

1. A process for producing a solar cell from a silicon wafer, comprising the steps of:

(a) removing any saw-damage on the wafer by a wet-chemical etching process, thereby defining surface texture on the water;

(b) depositing a phosphorous containing precursor on the wafer;

(c) placing the wafer in a furnace, thereby initiating emitter diffusion;

(d) removing a phosphorous glass layer, formed on the surface of the wafer during the emitter diffusion step, by a wet-chemical etching process;

(e) thermally annealing the wafer under an oxygen atmosphere;

(f) removing oxides from the wafer by a wet-chemical etching process;

(g) depositing a SiNx anti-reflection coating on the wafer;

(h) screen printing metallization pastes on the surface of the wafer;

(i) firing the metallization pastes formed on the surface of the wafer; and (j) laser ablating the wafer, thereby isolating the emitters and collectors formed at the edges of the wafer.

2. A process for producing a solar cell from a silicon wafer, comprising the steps of:

(a) removing any saw-damage on the wafer by a wet-chemical etching process, thereby defining surface texture on the wafer;

(b) depositing a phosphorous containing precursor on the wafer;

(c) placing the wafer in a furnace, thereby initiating emitter diffusion;

(d) removing a phosphorous glass layer, formed on the surface of the wafer during the emitter diffusion step, by a wet-chemical etching process;

(e) oxidizing the surface of the wafer by a wet-chemical process;

(f) removing oxides from the wafer by a wet-chemical etching process;

(g) depositing a SiNx anti-reflection coating on the wafer;

(h) screen printing metallization pastes on the surface of the wafer;

(i) firing the metallization pastes formed on the surface of the wafer; and (j) laser ablating the wafer, thereby isolating the emitters and collectors formed at the edges of the wafer.

* * * * *